US012584217B2

(12) United States Patent
Olson et al.

(10) Patent No.: US 12,584,217 B2
(45) Date of Patent: Mar. 24, 2026

(54) TRAY ASSEMBLIES FOR PRECURSOR DELIVERY SYSTEMS AND RELATED METHODS

(71) Applicant: ENTEGRIS, INC., Billerica, MA (US)

(72) Inventors: Benjamin Harrison Olson, Florence, TX (US); Jacob Thomas, Leander, TX (US); Scott L. Battle, Cedar Park, TX (US); Bryan C. Hendrix, Danbury, CT (US); Dalton Vance Locklear, Cedar Park, TX (US); Aniket Joshi, Burnet, TX (US); Christopher Calhoun, Burnet, TX (US)

(73) Assignee: Entegris, Inc., Billerica, MA (US)

( * ) Notice: Subject to any disclaimer, the term of this patent is extended or adjusted under 35 U.S.C. 154(b) by 408 days.

(21) Appl. No.: 18/197,051

(22) Filed: May 13, 2023

(65) Prior Publication Data

US 2023/0366085 A1 Nov. 16, 2023

Related U.S. Application Data

(60) Provisional application No. 63/341,832, filed on May 13, 2022.

(51) Int. Cl.
| | |
|---|---|
| *C23C 16/448* | (2006.01) |
| *C23C 16/08* | (2006.01) |
| *F17C 9/00* | (2006.01) |
| *F17C 9/02* | (2006.01) |
| *H01J 37/32* | (2006.01) |

(52) U.S. Cl.
CPC .......... C23C 16/4485 (2013.01); C23C 16/08 (2013.01); F17C 9/00 (2013.01); F17C 9/02 (2013.01); H01J 37/3244 (2013.01)

(58) Field of Classification Search
CPC ... C23C 16/4485; C23C 16/08; C23C 16/448; C23C 14/165; C23C 14/243; C23C 14/14; C23C 14/34; H01J 37/3244; F17C 9/00; F17C 9/02
USPC ........................................................ 118/726
See application file for complete search history.

(56) References Cited

U.S. PATENT DOCUMENTS

| | | | |
|---|---|---|---|
| 10,895,347 B2 | 1/2021 | Hendrix et al. | |
| 2010/0206484 A1 | 8/2010 | Hiromi | |
| 2019/0120433 A1 | 4/2019 | Hendrix | |
| 2020/0340110 A1 | 10/2020 | Hendrix et al. | |
| 2023/0115177 A1* | 4/2023 | Battle ............... | C23C 16/45544 |
| | | | 118/726 |

FOREIGN PATENT DOCUMENTS

| | | | |
|---|---|---|---|
| JP | 2014009392 A | 1/2014 | |
| KR | 101999485 B1 | 10/2019 | |
| KR | 102027179 B1 | 10/2019 | |
| KR | 20220047848 A | 4/2022 | |

* cited by examiner

*Primary Examiner* — Rodney G Mcdonald

(57) ABSTRACT

A tray assembly comprises a plurality of trays. Each of the plurality of trays comprises a first tray portion and a second tray portion which are couplable together by a retainer and which are engageable with a cam member. Depending on the orientation of the cam member, each of the plurality of trays of the tray assembly is configurable between an expanded configuration and a collapsed configuration. In the collapsed configuration, the tray assembly is insertable into an ampoule. In the expanded configuration, the tray assembly is removable from an ampoule.

20 Claims, 8 Drawing Sheets

202A 212A          214A          208A

218A 210A          220A

216A

TRAY ASSEMBLIES FOR PRECURSOR DELIVERY SYSTEMS AND RELATED METHODS

PRIORITY

This disclosure claims priority to U.S. Provisional Patent No. 63/341,832, with a filing date of May 13, 2022, which is hereby incorporated by reference.

FIELD

The present disclosure relates to configurable tray assemblies for precursor delivery systems and related methods.

BACKGROUND

Precursor delivery includes production of vapor precursors from solid precursor materials contained in ampoules. The vapor precursors are delivered downstream to tools, such as, semiconductor processing tools and the like.

SUMMARY

Some embodiments of the present disclosure relate to a tray assembly. In some embodiments, the tray assembly comprises a first tray portion and a second tray portion. In some embodiments, the first tray portion and the second tray portion are configured to be couplable by a retainer and to be engageable with a cam member, such that, when coupled together by the retainer, the first tray portion and the second tray portion are configurable between an expanded configuration and a collapsed configuration based on an orientation of the cam member.

In some embodiments, the first tray portion comprises a first pedestal member portion, and the second tray portion comprises a second pedestal member portion.

In some embodiments, the retainer, when disposed at an outer perimeter of the first pedestal member portion and the second pedestal member portion, couples the first pedestal member portion and the second pedestal member portion together so as to define a pedestal member.

In some embodiments, the retainer comprises at least one of an elastomeric band, a compressible ring, a circular spring, or any combination thereof.

In some embodiments, the first tray portion comprises a first slot member portion; and the second tray portion comprises a second slot member portion. In some embodiments, when the first tray portion and the second tray portion are coupled together by the retainer, the first slot member portion and the second slot member portion define a slot member.

In some embodiments, the cam member is configured to be aligned between the first slot member portion and the second slot member portion.

In some embodiments, the cam member is configurable between a first orientation and a second orientation. In some embodiments, in the first orientation, the cam member is configured to engage with the slot member. In some embodiments, in the second orientation, the cam member is configured to not engage with the slot member.

In some embodiments, in the first orientation, the cam member pushes against the slot member, such that the first tray portion and the second tray portion are configured in the expanded configuration.

In some embodiments, in the second orientation, the cam member does not push against the slot member, such that the first tray portion and the second tray portion are configured in the collapsed configuration.

In some embodiments, the cam member further comprises a locking member, wherein the locking member is configured to be insertable between the first tray portion and the second tray portion so as to lock the first tray portion and the second tray portion in the expanded configuration.

In some embodiments, in the collapsed configuration, the first tray portion and the second tray portion are configured to be supported on the locking member.

In some embodiments, at least one of the first tray portion and the second tray portion comprises a plurality of slits.

In some embodiments, the cam member further comprises a hollow shaft member defining a vapor pathway.

Some embodiments of the present disclosure relate to a precursor delivery system. In some embodiments, the precursor delivery system comprises an ampoule; and a tray assembly according to any one of the embodiments disclosed herein in any combination.

In some embodiments, in the expanded configuration, the first tray portion and the second tray portion push against an inner wall surface of the ampoule so as to be in thermal contact with the ampoule.

In some embodiments, in the expanded configuration, the first tray portion and the second tray portion define a vapor pathway between the first tray portion and the second tray portion.

In some embodiments, in the collapsed configuration, the first tray portion and the second tray portion are not in thermal contact with an inner wall surface of the ampoule.

Some embodiments of the present disclosure relate to a method. In some embodiments, the method comprises a step of obtaining a tray assembly according to any one of the embodiments disclosed herein in any combination. In some embodiments, the method comprises a step of orienting the cam member such that the first tray portion and the second tray portion are configured in the collapsed configuration. In some embodiments, the method comprises a step of inserting the tray assembly into an inner chamber of an ampoule. In some embodiments, the method comprises a step of orienting the cam member such that the first tray portion and the second tray portion are configured in the expanded configuration.

In some embodiments, the method further comprises a step of orienting the cam member such that the first tray portion and the second tray portion are configured in the collapsed configuration; and removing the tray assembly from the inner chamber of the ampoule.

Some embodiments of the present disclosure relate to a tray. In some embodiments, the tray comprises a body. In some embodiments, the body has a collapsed configuration and an expanded configuration. In some embodiments, the expanded configuration comprises an opening through the body which defines a pathway therethrough.

In some embodiments, the collapsed configuration does not comprise the opening through the body.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
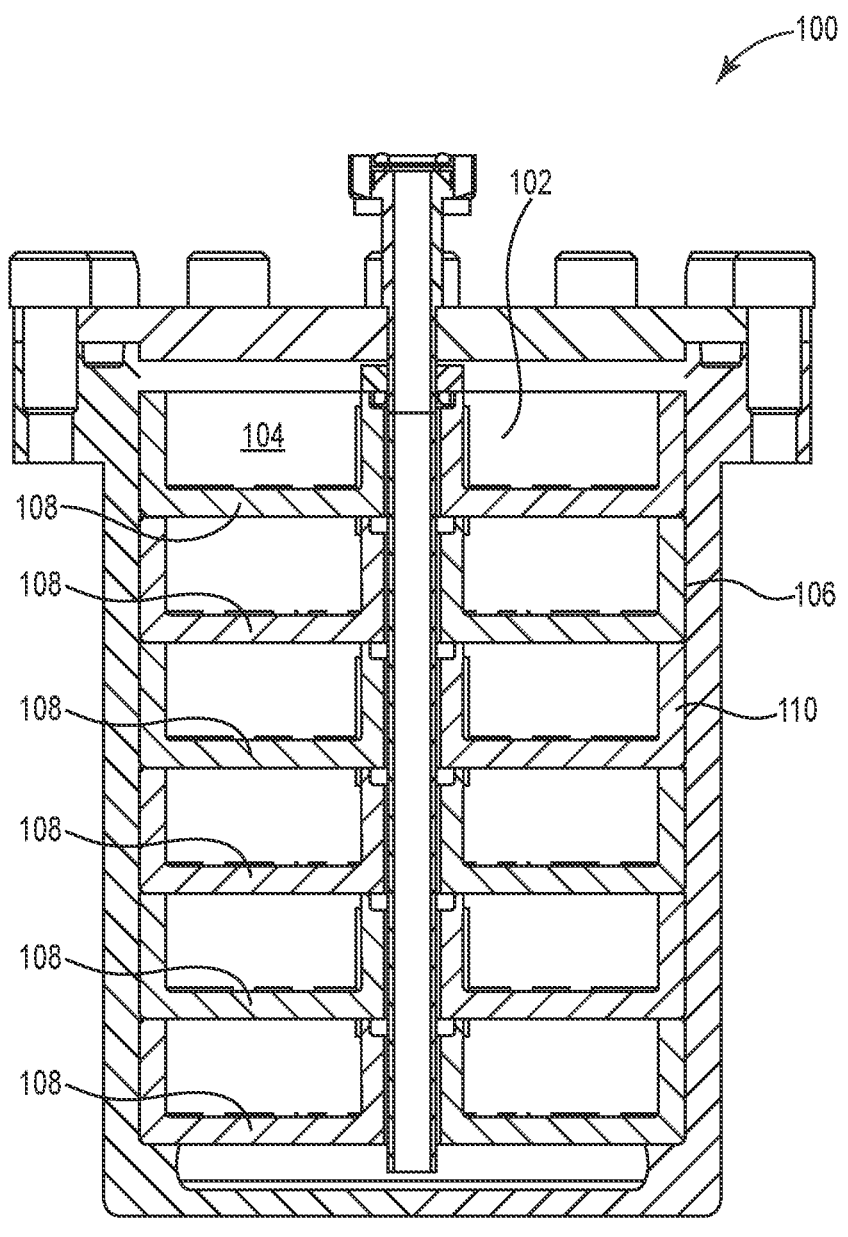
FIG. 1 depicts a schematic sectional view of a non-limiting embodiment of an ampoule 100, according to some embodiments.

FIG. 1 depicts a schematic sectional view of a non-limiting embodiment of an ampoule 100, according to some embodiments. The ampoule 100 contains a tray assembly 102 in an inner chamber 104 of the ampoule 100. The inner chamber 104 has an inner wall surface 106. The tray assembly 102 comprises trays 108, each of which are configured to contain a vaporizable precursor. Each of the trays 108 of the tray assembly 102 comprises a portion 110 which is configured to be in contact (e.g., thermal contact, physical contact, etc.) with the inner wall surface 106 of the ampoule 100. The surface-to-surface contact of the portion 110 with the inner wall surface 106 enhances heat transfer from the ampoule 100 to each tray 108 and thus from each tray 108 to the vaporizable precursor on each tray 108. Various fluid flow paths are defined within the inner chamber 104 of the ampoule 100 such that a fluid is allowed to flow through the ampoule 100 upwards, downwards, or both. The ampoule 100 is shown having a generally cylindrical inner chamber. However, it will be appreciated that the inner chamber 104 of the ampoule may have other shapes without departing from the scope of this disclosure.

The trays 108 of the tray assembly 102 are configurable between an expanded configuration and a collapsed configuration. In the expanded configuration, the diameter of each tray 108 is increased by an amount sufficient for each portion of each tray 108 to push against the inner wall surface 106 of the ampoule 100. This radially outward expansion of each tray 108 enhances thermal contact with the inner wall surface 106 of the ampoule 100, while also serving to wedge each tray 108 and the tray assembly 102 in the inner chamber 104 of the ampoule 100. In the collapsed configuration, a diameter of each tray 108 is less than a diameter of the inner chamber 104 of the ampoule 100. This radially inward collapse of the each tray 108 reduces the size of tray assembly 102 such that the tray assembly 102 can be installed and removed from ampoules of all sizes and depths with relative ease. The tray assembly 102 is thus insertable into the inner chamber 104 of the ampoule 100 in the collapsed configuration and, upon being inserted, the tray assembly 102 is configurable in the expanded configuration to achieve thermal contact with the ampoule 100. The tray assembly 102 can then be reconfigured in the collapsed configuration for removal from the ampoule 100.

Figure 2A:
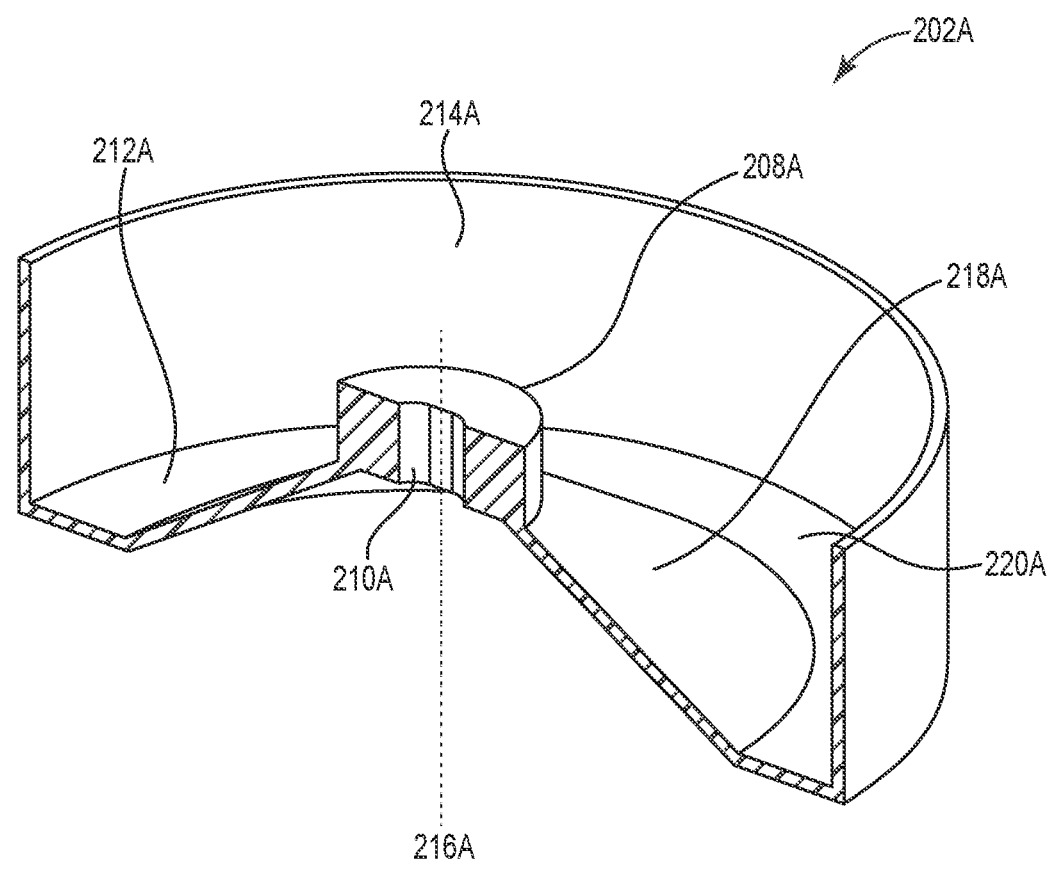
FIG. 2A depicts a schematic perspective view of a first tray portion, according to some embodiments.
Figure 2B:
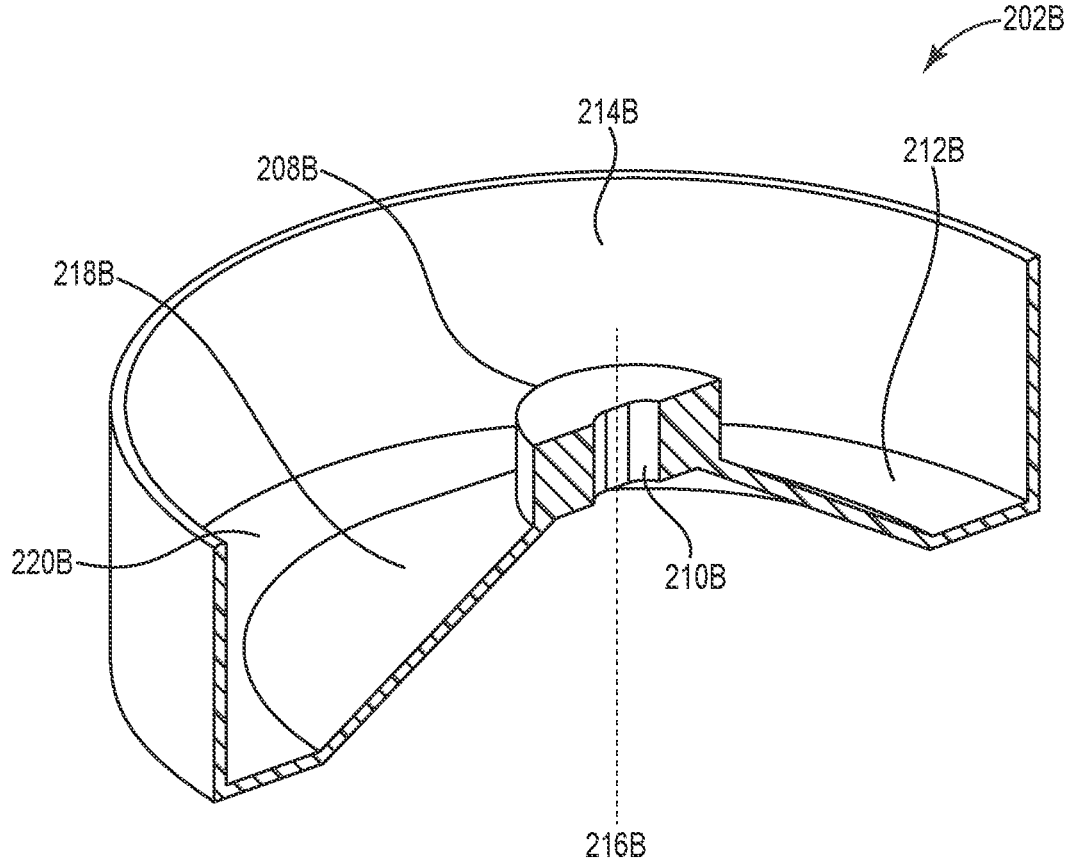
FIG. 2B depicts a schematic perspective view of a second tray portion, according to some embodiments.
Figure 2C:
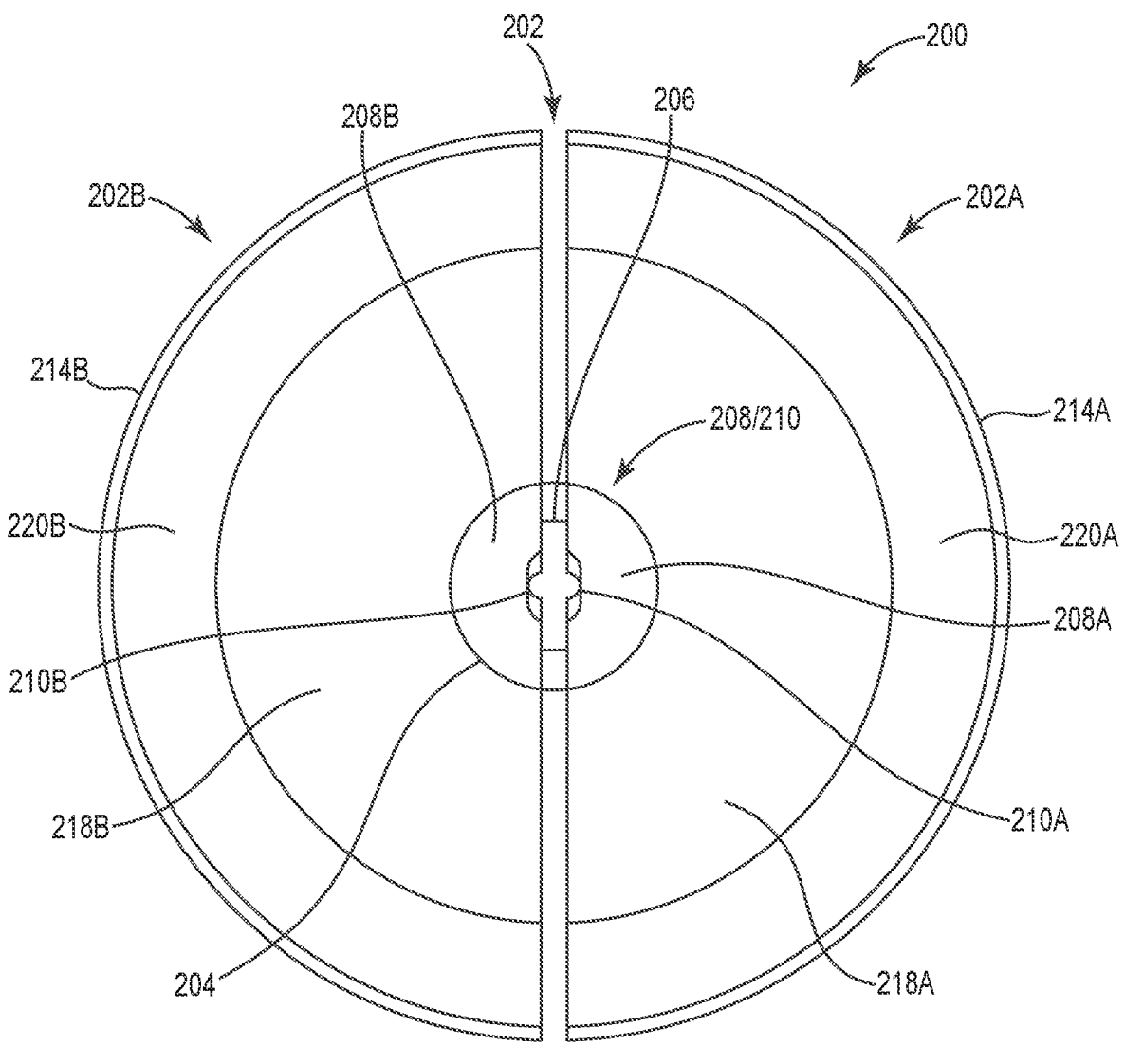
FIG. 2C depicts a schematic plan view of a tray assembly configured in an expanded configuration, according to some embodiments.
Figure 2D:
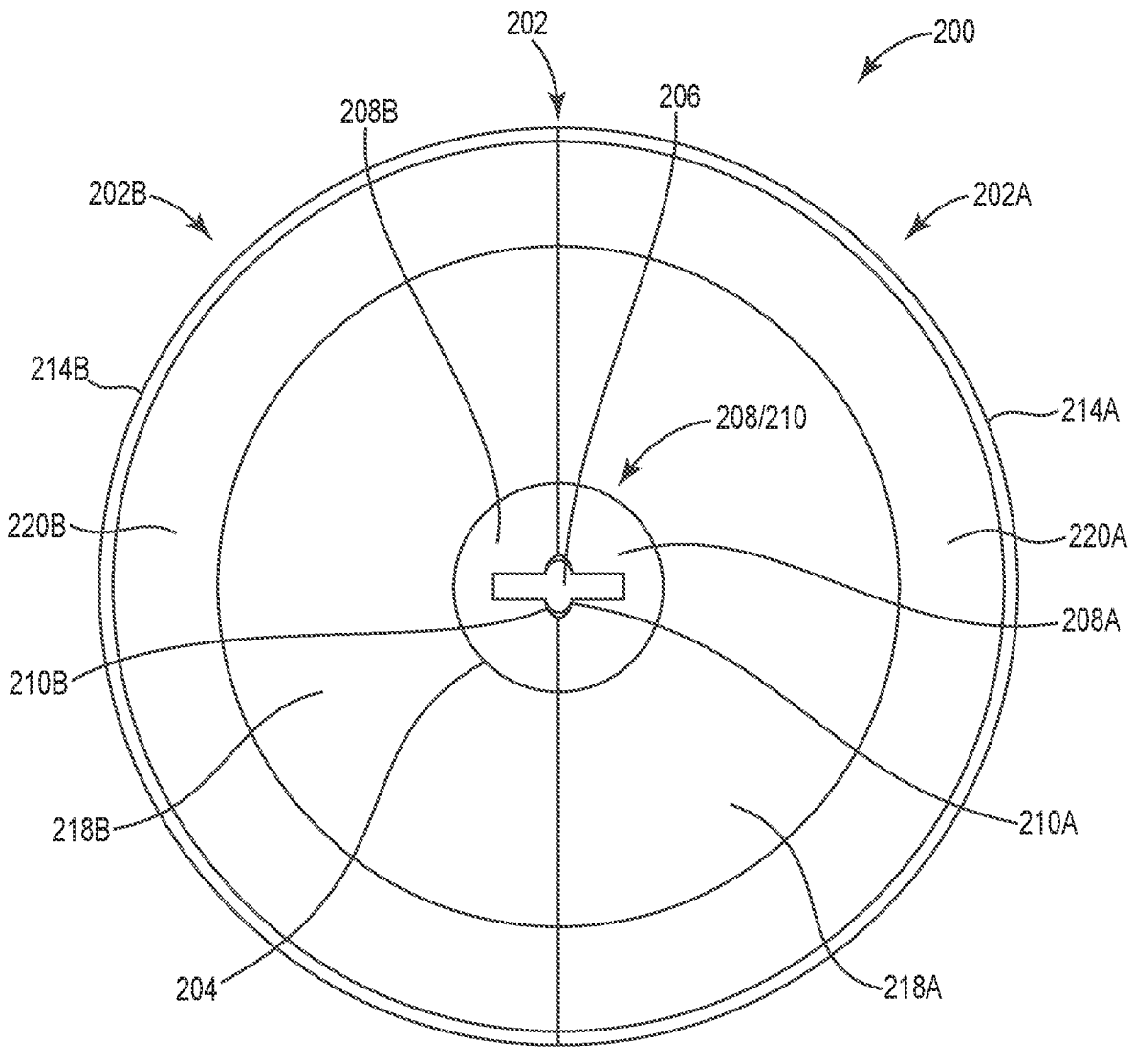
FIG. 2D depicts a schematic plan view of the tray assembly configured in a collapsed configuration, according to some embodiments.
Figure 2E:
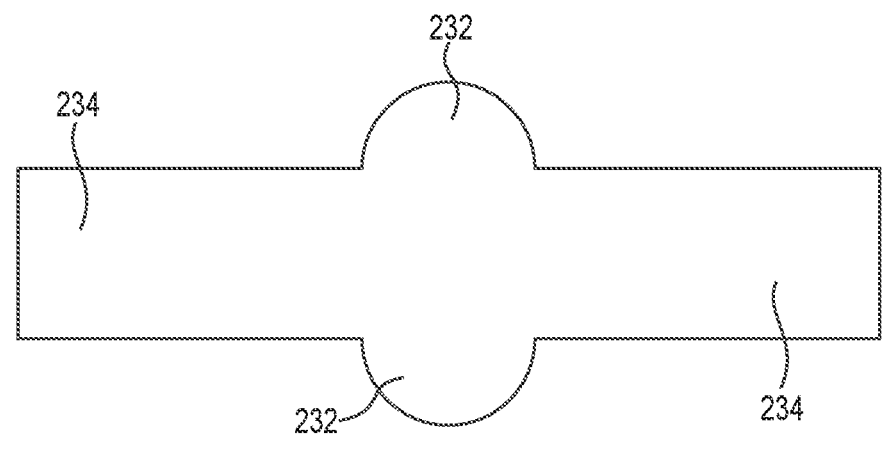
FIG. 2E depicts a schematic plan view of a cam member, according to some embodiments.

FIGS. 2A-2D depict various aspects of a tray assembly 200. The tray assembly 200 comprises a first tray portion 202A and a second tray portion 202B. The first tray portion 202A and the second tray portion 202B are couplable together by a retainer 204 and are engageable with a cam member 206. Depending on the orientation of the cam member 206, the tray 202 is configurable between an expanded configuration and a collapsed configuration. FIG. 2A depicts a schematic perspective view of the first tray portion 202A. FIG. 2B depicts a schematic perspective view of the second tray portion 202B. FIG. 2C depicts a schematic plan view of the tray assembly in an expanded configuration. FIG. 2D depicts a schematic plan view of the tray assembly in the collapsed configuration. FIG. 2E depicts a schematic plan view of the cam member 206. The various aspects of the tray assembly depicted in each of the FIGS. 2A-2E are discussed in more detail below.

FIG. 2A depicts a schematic perspective view of a non-limiting embodiment of the first tray portion 202A, according to some embodiments. The first tray portion 202A comprises a first pedestal member portion 208A, a first slot member portion 210A, a first base plate 212A, and a first arced wall component 214A. The first pedestal member portion 208A and the first slot member portion 210A are generally located on or near a central vertical axis 216A. The first base plate 212A connects the first pedestal member portion 208A to the first arced wall component 214A. As shown, the first base plate 212A has a sloped portion 218A that transitions to a non-sloped portion 220A near the periphery of the first base plate 212A. The non-sloped portion 220A is connected to the first arced wall component 214A which extends around the entire periphery of the first base plate 212A, except where the first tray portion 202A is couplable to the second tray portion 202B.

FIG. 2B depicts a schematic perspective view of a non-limiting embodiment of the second tray portion 202B, according to some embodiments. The second tray portion 202B comprises a second pedestal member portion 208B, a second slot member portion 210B, a second base plate 212B, and a second arced wall component 2148. The second pedestal member portion 208B and the second slot member portion 2108 are generally located on or near a central vertical axis 2168. The second base plate 2128 connects the second pedestal member portion 208B to the second arced wall component 214B. As shown, the second base plate 2128 has a sloped portion 2188 that transitions to a non-sloped portion 220B near the periphery of the second base plate 212B. The non-sloped portion 220B is connected to the second arced wall component 214B which extends around the entire periphery of the second base plate 212B, except where the second tray portion 202B is couplable to the first tray portion 202A.

In FIGS. 2C-2D, the first tray portion 202A and the second tray portion 202B are shown assembled together to obtain the tray assembly 200. When assembled together, the retainer 204 is provided at an outer periphery of the first pedestal member portion 208A and the second pedestal member portion 208B. The retainer 204 may comprise at least one of an elastomeric band, a compressible ring, a circular spring, or any other similar component. Being located at the outer periphery and generally compressive, the retainer 204 applies a radially inward force sufficient to couple the first pedestal member portion 208A and the second pedestal member portion 208B together so as to define the pedestal member 208. Because the first slot member portion 210A and the second slot member portion 210B are formed in the first pedestal member portion 208A and the second pedestal member portion 208B, coupling the first pedestal member portion 208A and the second pedestal member portion 208B also defines the slot member 210. It will be appreciated that direct surface-to-surface contact between two components is not required for the two components to be couplable or coupled together.

FIG. 2E depicts a schematic plan view of the cam member 206, according to some embodiments. As shown in FIG. 2E, the cam member 206 includes cams 232 and pins 234. Returning now to FIGS. 2C-2D, the cam member 206 is shown disposed between the first tray portion 202A and the second tray portion 202B and is rotatably aligned with the first slot member portion 210A and the second slot member portion 210B. Being rotatably aligned, the cam member 206 is configurable between various orientations in which the cams 232 of the cam member 206 engage or do not engage with the slot member 210. For example, in FIG. 2C, the cam member 206 is oriented such that the cams 232 engage with the slot member 210. By engaging in this way, the cams 232 push against the slot member 210 sufficient for the first tray portion 202A and the second tray portion 202B to be separated apart while still couplable together by the retainer 204. The opening formed between the first tray portion 202A and the second tray portion 202B defines a fluid or vapor pathway. In some embodiments, the pins 234 of the cam member 206 are used to lock the tray 202 in the expanded configuration. That is, the pins 234 of the cam member 206 are positioned or wedged between the first tray portion 202A and the second tray portion 202B, thereby locking the first tray portion 202A and the second tray portion 202B in place. Once unlocked, the cam member 206 can be rotated in either direction to configure or reconfigure the tray assembly 200 in the collapsed configuration. By rotating the cam member 206, the cams 232 disengage from the slot member 210 sufficient for the first tray portion 202A and the second tray portion 202B to collapse together. As shown in FIG. 2D, in the collapsed configuration, neither the cams 232 nor the cam member 206 engages with the slot member 210 or, if either does engage, such engagement is to a lesser extent than the engagement observed in the expanded configuration. In the collapsed configuration, the pins can be positioned above or below the pedestal member 208.

Figure 3:
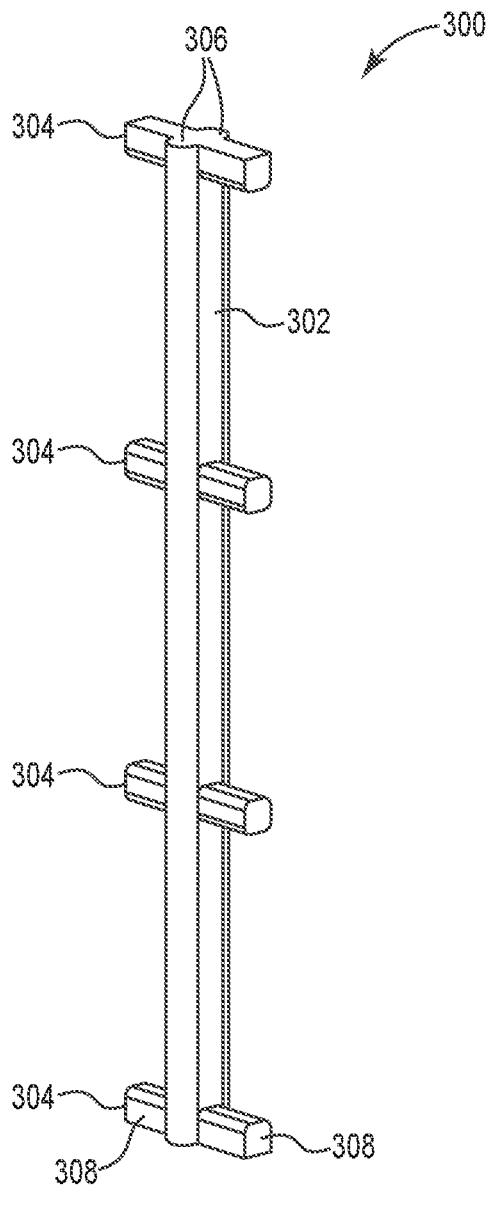
FIG. 3 depicts a schematic plan view of the cam member tool, according to some embodiments.

FIG. 3 depicts a schematic plan view of a cam member tool 300, according to some embodiments. The cam member tool 300 comprises a shaft 302 and cam members 304 positioned along a length of the shaft 302. In some embodiments, the shaft 302 is hollow so as to define a fluid or vapor pathway. Each of the cam members 304 comprises cams 306 and pins 308. Each of the cam members 304 is configured to be rotatably aligned between slot member portions of different trays. That is, each of the cam members 304 is engageable with a slot member from different trays such that a tray assembly comprises a plurality of trays, each of which is configurable between an expanded configuration and a collapsed configuration. As shown in FIG. 3, the cam member tool 300 is configured for three (3) trays, up to four (4) total trays. For example, a tray assembly employing the cam member tool 300 may comprise three separate trays on each of the cam members 304. In the collapsed configuration, the cam member tool 300 is configured to support each of the three trays on the pins 308 of the each of the cam members 304. That is, the pins 308 of each of the cam members 304 are positioned below each tray such that each tray rests on the pins 308. In this configuration, the tray assembly is insertable and removable from an ampoule. In the expanded configuration, the cams 306 of the cam members 304 are aligned between and engage with the slot members of each of the trays such that the first tray portions and the second tray portions of each of the trays separates apart so as to achieve the expanded configuration. The configuration of the trays between the expanded and collapsed configurations can be performed in unison. Although the cam member tool 300 is configured for three (3) to four (4) total trays, it will be appreciated that the cam member tool 300 can be configured for one (1) to one-hundred (100) trays, or any number between one (1) and one-hundred (100) trays.

Figure 4:
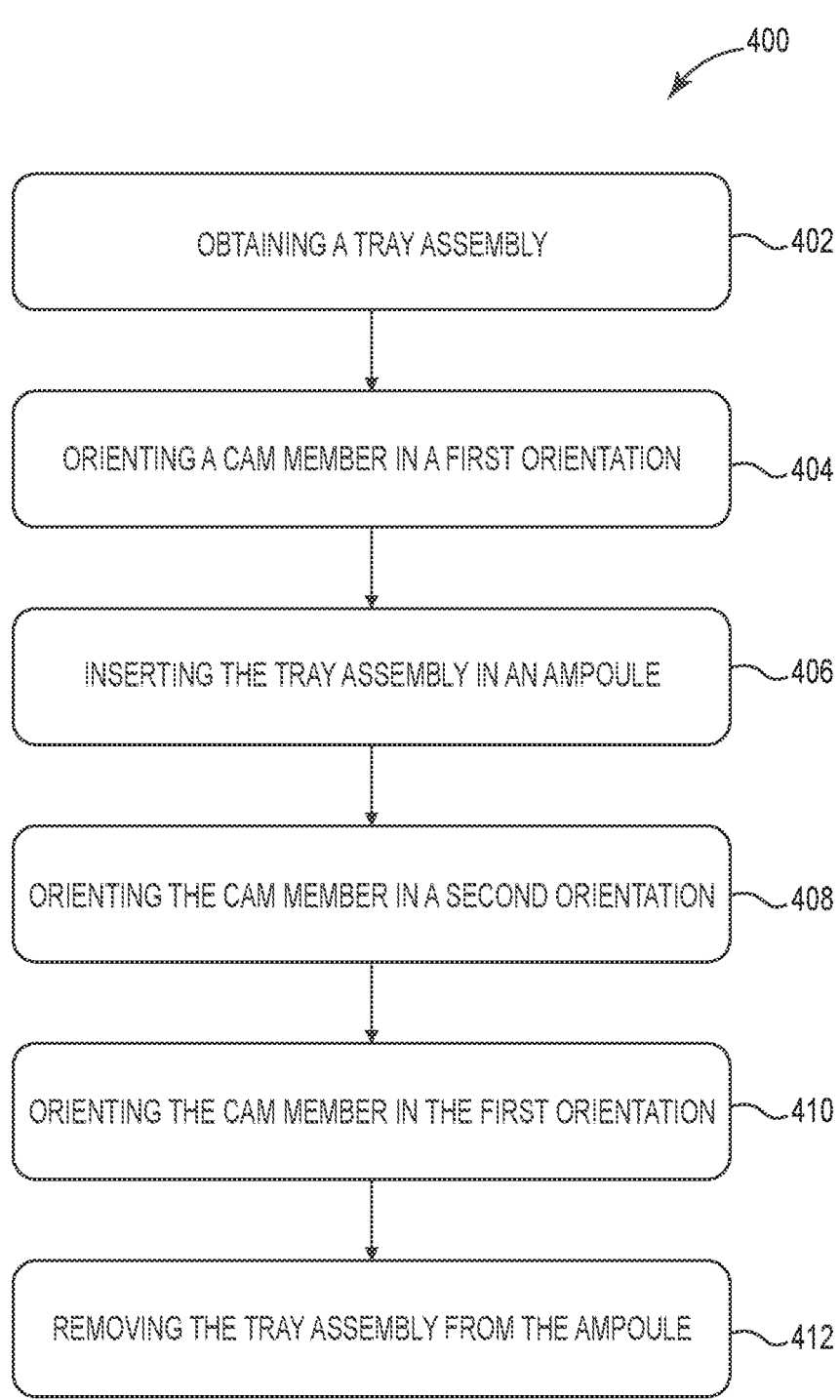
FIG. 4 depicts a flowchart of a method of using a tray assembly, according to some embodiments.

FIG. 4 is a flowchart of a method 400, according to some embodiments. As shown in FIG. 4, the method 400 may comprise one or more of the following steps, in any order: a step 402 of obtaining a tray assembly according to any one or more of the embodiments disclosed herein in any combination; a step 404 of orienting the cam member in a first orientation such that the first tray portion and the second tray portion are configured in the collapsed configuration; a step 406 of inserting the tray assembly into an inner chamber of an ampoule; a step 408 of orientating the cam member in a second orientation such that the first tray portion and the second tray portion are configured in the expanded configuration; a step 410 of orienting the cam member in the first orientation such that the first tray portion and the second tray portion are configured in the collapsed configuration; and a step 412 of removing the tray assembly from the inner chamber of the ampoule.

Any of the components of the present disclosure may comprise a heat-conducting material. Examples of heat-conducting materials include, without limitation, at least one of stainless steel, silver, silver alloy, copper, copper alloy, aluminum, aluminum alloy, lead, nickel, nickel clad, graphite, pyrolytic carbon coated graphite, silicon carbide coated graphite, boron nitride, ceramic material, any combination thereof, any alloy thereof, or any composite thereof. In some embodiments, the tray(s) or any portion thereof comprise at least one of stainless steel, silver, silver alloy, copper, copper alloy, aluminum, aluminum alloy, lead, nickel, nickel clad, graphite, pyrolytic carbon coated graphite, silicon carbide coated graphite, boron nitride, ceramic material, any combination thereof, any alloy thereof, or any composite thereof. In some embodiments, the tray(s) or any portion thereof comprise at least one of graphite, nickel, stainless steel, aluminum alloy, or any combination thereof. In some embodiments, the tray(s) or any portion thereof is/are coated with nickel using sputtering deposition. In some embodiments, the tray(s) or any portion thereof is/are coated with graphite. In some embodiments, the graphite comprises polycrystalline graphite having an amorphous carbon content of 20% to 80% by volume based on a total volume of the graphite.

The tray(s) is/are configured to contain the vaporizable precursor. The vaporizable precursor may comprise, consist of, or consist essentially of at least one of an elemental metal, a metal halide, a metal oxyhalide, an organometallic compound, a metalorganic complex, or any combination thereof.

In some embodiments, the vaporizable precursor comprises, consists of, or consists essentially of at least one of dimethyl hydrazine, trimethyl aluminum (TMA), hafnium chloride (HfCl$_4$), zirconium chloride (ZrCl$_4$), indium trichloride, indium monochloride, aluminum trichloride, titanium iodide, tungsten carbonyl, Ba(DPM)$_2$, bis dipivaloyl methanato strontium (Sr(DPM)$_2$), TiO(DPM)$_2$, tetra dipivaloyl methanato zirconium (Zr(DPM)$_4$), decaborane, octadecaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide (Zr(t-OBu)$_4$), tetrakisdiethylaminozirconium (Zr(Net$_2$)$_4$), tetrakisdiethylaminohafnium (Hf(Net$_2$)$_4$), tetrakis (dimethylamino) titanium (TDMAT), tertbutyliminotris (diethylamino) tantalum (TBTDET), pentakis (dimethylamino) tantalum (PDMAT), pentakis (ethylmethylamino) tantalum (PEMAT), tetrakisdimethylaminozirconium (Zr(NMe$_2$)$_4$), hafniumtertiarybutoxide (Hf(tOBu)$_4$), xenon difluoride (XeF$_2$), xenon tetrafluoride (XeF$_4$), xenon hexafluoride (XeF$_6$), or any combination thereof.

In some embodiments, the vaporizable precursor comprises, consists of, or consists essentially of at least one of decaborane, hafnium tetrachloride, zirconium tetrachloride, indium trichloride, metalorganic β-diketonate complexes, tungsten hexafluoride, cyclopentadienylcycloheptatrienyltitanium (CpTiCht), aluminum trichloride, titanium iodide, cyclooctatetraenecyclo-pentadienyltitanium, biscyclopentadienyltitaniumdiazide, trimethyl gallium, trimethyl indium, aluminum alkyls like trimethylaluminum, triethylaluminum, trimethylamine alane, dimethyl zinc, tetramethyl tin, trimethyl antimony, diethyl cadmium, tungsten carbony, or any combination thereof.

In some embodiments, the vaporizable precursor comprises, consists of, or consists essentially of at least one of elemental boron, copper, phosphorus, decaborane, gallium halides, indium halides, antimony halides, arsenic halides, gallium halides, aluminum iodide, titanium iodide, MoO$_2$Cl$_2$, MoOCl$_4$, MoCl$_5$, WCl$_5$, WOCl$_4$, WCl$_6$, cyclopentadienylcycloheptatrienyltitanium (CpTiCht), cyclooctatetraenecyclopenta-dienyltitanium, biscyclopentadienyltitanium-diazide, In(CH$_3$)$_2$(hfac), dibromomethyl stibine, tungsten carbonyl, metalorganic β-diketonate complexes, metalorganic alkoxide complexes, metalorganic carboxylate complexes, metalorganic aryl complexes, metalorganic amido complexes, or any combination thereof. In some embodiments, the vaporizable precursor comprises, consists of, or consists essentially of at least one of MoO$_2$Cl$_2$, MoOCl$_4$, WO$_2$Cl$_2$, WOCl$_4$, or any combination thereof.

In some embodiments, the vaporizable precursor comprises, consists of, or consists essentially of at least one of any type of source material that can be liquefied either by heating or solubilization in a solvent including, for example and without limitation, at least one of decaborane, (B$_{10}$H$_{14}$), pentaborane (B$_5$H$_9$), octadecaborane (B1$_8$H$_{22}$), boric acid (H$_3$BO$_3$), SbCl$_3$, SbCl$_5$, or any combination thereof. In some embodiments, the vaporizable precursor comprises, consists of, or consists essentially of at least one of at least one of AsCl$_3$, AsBr$_3$, AsF$_3$, AsF$_5$, AsH$_3$, As$_4$O$_6$, As$_2$Se$_3$m As$_2$S$_2$, As$_2$S$_3$, As$_2$S$_5$, As$_2$Te$_3$, B$_4$H$_{11}$, B$_4$H$_{10}$, B$_3$H$_6$N$_3$, BBr$_3$, BCl$_3$, BF$_3$, BF$_3$·O(C$_2$H$_5$)$_2$, BF$_3$·HOCH$_3$, B$_2$H$_6$, F$_2$, HF, GeBr$_4$, GeCl$_4$, GeF$_4$, GeH$_4$, H$_2$, HCl, H$_2$Se, H$_2$Te, H$_2$S, WF$_6$, SiH$_4$, SiH$_2$Cl$_2$, SiHCl$_3$, SiCl$_4$, SiH$_3$Cl, NH$_3$, NH$_3$, Ar, Br$_2$, HBr, BrF$_5$, CO$_2$, CO, COCl$_2$, COF$_2$, C$_{12}$, ClF$_3$, CF$_4$, C$_2$F$_6$, C$_3$F$_8$, C$_4$F$_8$, C$_5$F$_8$, CHF$_3$, CH$_2$F$_2$, CH$_3$F, CH$_4$, SiH$_6$, He, HCN, Kr, Ne, Ni(CO)$_4$, HNO$_3$, NO, N$_2$, NO$_2$, NF$_3$, N$_2$O, C$_8$H$_{24}$O$_4$Si$_4$, PH$_3$, POCl$_3$, PCIS, PF$_3$, PFS, SbH$_3$, SO$_2$, SF$_6$, SF$_4$, Si(OC$_2$H$_5$)$_4$, C$_4$H$_{16}$Si$_4$O$_4$, Si(CH$_3$)$_4$, SiH(CH$_3$)$_3$, TiCl$_4$, Xe, SiF$_4$, WOF$_4$, TaBr$_5$, TaCl$_5$, TaF$_5$, Sb(C$_2$H$_5$)$_3$, Sb(CH$_3$)$_3$, In(CH$_3$)$_3$, PBr$_5$, PBr$_3$, RuF$_5$, or any combination thereof.

In some embodiments, the solvent(s) is an organic solvent, an inorganic solvent, or any combination hereof. In some embodiments, the solvent(s) contains forms of arsenic, phosphorus, antimony, germanium, indium, tin, selenium, tellurium, fluorine, carbon, boron, aluminum, bromine, carbon, chlorine, nitrogen, silicon, tungsten, tantalum, ruthenium, selenium, nickel, sulfur, or any combination thereof. It will be appreciated that other vaporizable precursors may be used herein without departing from this disclosure.

Aspects

Various Aspects are described below. It is to be understood that any one or more of the features recited in the following Aspect(s) can be combined with any one or more other Aspect(s).

Aspect 1. A tray assembly comprising:
a first tray portion; and
a second tray portion;
wherein the first tray portion and the second tray portion are configured to be couplable by a retainer and to be engageable with a cam member, such that, when coupled together by the retainer,
the first tray portion and the second tray portion are configurable between an expanded configuration and a collapsed configuration based on an orientation of the cam member.

Aspect 2. The tray assembly according to aspect 1, wherein
the first tray portion comprises a first pedestal member portion, and
the second tray portion comprises a second pedestal member portion,
wherein the retainer, when disposed at an outer perimeter of the first pedestal member portion and the second pedestal member portion, couples the first pedestal member portion and the second pedestal member portion together so as to define a pedestal member.

Aspect 3. The tray assembly according to any one of aspects 1-2, wherein the retainer comprises at least one of an elastomeric band, a compressible ring, a circular spring, or any combination thereof.

Aspect 4. The tray assembly according to any one of aspects 1-3, wherein the first tray portion comprises a first slot member portion; and the second tray portion comprises a second slot member portion, wherein, when the first tray portion and the second tray portion are coupled together by the retainer, the first slot member portion and the second slot member portion define a slot member.

Aspect 5. The tray assembly according to aspect 4, wherein the cam member is configured to be aligned between the first slot member portion and the second slot member portion.

Aspect 6. The tray assembly according to aspect 5, wherein the cam member is configurable between a first orientation and a second orientation, wherein, in the first orientation, the cam member is configured to engage with the slot member, wherein, in the second orientation, the cam member is configured to not engage with the slot member.

Aspect 7. The tray assembly according to aspect 6, wherein, in the first orientation, the cam member pushes against the slot member, such that the first tray portion and the second tray portion are configured in the expanded configuration.

Aspect 8. The tray assembly of according to aspect 6, wherein, in the second orientation, the cam member does not push against the slot member, such that the first tray portion and the second tray portion are configured in the collapsed configuration.

Aspect 9. The tray assembly according to aspect 5, wherein the cam member further comprises a locking member, wherein the locking member is configured to be insertable between the first tray portion and the second tray portion so as to lock the first tray portion and the second tray portion in the expanded configuration.

Aspect 10. The tray assembly according to aspect 9, wherein, in the collapsed configuration, the first tray portion and the second tray portion are configured to be supported on the locking member.

Aspect 11. The tray assembly according to any one of aspects 1-10, wherein at least one of the first tray portion and the second tray portion comprise a plurality of slits.

Aspect 12. The tray assembly according to any one of aspects 1-11, wherein the cam member further comprises a hollow shaft member defining a vapor pathway.

Aspect 13. The tray assembly according to any one of aspects 1-12, wherein the first tray portion and the second tray portion comprise at least one of stainless steel, silver, silver alloy, copper, copper alloy, aluminum, aluminum alloy, lead, nickel, nickel clad, graphite, pyrolytic carbon coated graphite, silicon carbide coated graphite, boron nitride, ceramic material, any combination thereof, any alloy thereof, or any composite thereof.

Aspect 14. The tray assembly according to any one of aspects 1-13, wherein the first tray portion and the second tray portion comprise at least one of graphite, nickel, stainless steel, aluminum alloy, or any combination thereof.

Aspect 15. The tray assembly according to any one of aspects 1-14, wherein the first tray portion and the second tray portion comprise aluminum alloy and wherein the first tray portion and the second tray portion are configured to contain a vaporizable precursor comprises a metal halide.

Aspect 16. The tray assembly according to any one of aspects 1-15, wherein the first tray portion and the second tray portion are coated with nickel using sputtering deposition.

Aspect 17. The tray assembly according to any one of aspects 1-16, wherein the first tray portion and the second tray portion are coated with graphite, wherein the graphite comprises polycrystalline graphite having an amorphous carbon content of 20% to 80% by volume based on a total volume of the graphite.

Aspect 18. A precursor delivery system comprising:

an ampoule; and the tray assembly according any one of claims 1-17.

Aspect 19. The precursor delivery system according to aspect 18, wherein, in the expanded configuration, the first tray portion and the second tray portion push against an inner wall surface of the ampoule so as to be in thermal contact with the ampoule.

Aspect 20. The precursor delivery system according to aspect 18, wherein, in the expanded configuration, the first tray portion and the second tray portion define a vapor pathway between the first tray portion and the second tray portion.

Aspect 21. The precursor delivery system according to aspect 18, wherein, in the collapsed configuration, the first tray portion and the second tray portion are not in thermal contact with an inner wall surface of the ampoule.

Aspect 22. A method comprising:

obtaining the tray assembly according to any one of aspects 1-17;

orienting the cam member such that the first tray portion and the second tray portion are configured in the collapsed configuration;

inserting the tray assembly into an inner chamber of an ampoule; and orienting the cam member such that the first tray portion and the second tray portion are configured in the expanded configuration.

Aspect 23. The method according to aspect 22, further comprising:

orienting the cam member such that the first tray portion and the second tray portion are configured in the collapsed configuration; and removing the tray assembly from the inner chamber of the ampoule.

Aspect 24. A tray comprising:

a body, wherein the body has a collapsed configuration and an expanded configuration, wherein the expanded configuration comprises an opening through the body which defines a pathway therethrough.

Aspect 25. The tray according to aspect 24, wherein the collapsed configuration does not comprise the opening through the body.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A tray assembly comprising:

a first tray portion; and a second tray portion;

wherein the first tray portion and the second tray portion are configured to be couplable by a retainer and to be engageable with a cam member, such that, when coupled together by the retainer, the first tray portion and the second tray portion are configurable between an expanded configuration and a collapsed configuration based on an orientation of the cam member.

2. The tray assembly of claim 1, wherein the first tray portion comprises a first pedestal member portion, and the second tray portion comprises a second pedestal member portion, wherein the retainer, when disposed at an outer periphery of the first pedestal member portion and the second pedestal member portion, couples the first pedestal member portion and the second pedestal member portion together so as to define a pedestal member.

3. The tray assembly of claim 1, wherein the retainer comprises at least one of an elastomeric band, a compressible ring, a circular spring, or any combination thereof.

4. The tray assembly of claim 1, wherein the first tray portion comprises a first slot member portion; and the second tray portion comprises a second slot member portion, wherein, when the first tray portion and the second tray portion are coupled together by the retainer, the first slot member portion and the second slot member portion define a slot member.

5. The tray assembly of claim 4, wherein the cam member is configured to be aligned between the first slot member portion and the second slot member portion.

6. The tray assembly of claim 5, wherein the cam member is configurable between a first orientation and a second orientation, wherein, in the first orientation, the cam member is configured to engage with the slot member, wherein, in the second orientation, the cam member is configured to not engage with the slot member.

7. The tray assembly of claim 6, wherein, in the first orientation, the cam member pushes against the slot member, such that the first tray portion and the second tray portion are configured in the expanded configuration.

8. The tray assembly of claim 6, wherein, in the second orientation, the cam member does not push against the slot member, such that the first tray portion and the second tray portion are configured in the collapsed configuration.

9. The tray assembly of claim 5, wherein the cam member further comprises:

a locking member, wherein the locking member is configured to be insertable between the first tray portion and the second tray portion so as to lock the first tray portion and the second tray portion in the expanded configuration.

10. The tray assembly of claim 9, wherein, in the collapsed configuration, the first tray portion and the second tray portion are configured to be supported on the locking member.

11. The tray assembly of claim 1, wherein at least one of the first tray portion and the second tray portion comprise a plurality of slits.

12. The tray assembly of claim 1, wherein the cam member further comprises a hollow shaft member defining a vapor pathway.

13. The tray assembly of claim 1, wherein the first tray portion and the second tray portion comprise at least one of stainless steel, silver, copper, aluminum, lead, nickel, nickel clad on a different material, graphite, pyrolytic carbon coated graphite, silicon carbide coated graphite, ceramic material, any combination thereof, any alloy thereof, or any composite thereof.

14. The tray assembly of claim 1, wherein the first tray portion and the second tray portion comprise at least one of graphite, nickel, stainless steel, aluminum alloy, or any combination thereof.

15. The tray assembly of claim 1, wherein the first tray portion and the second tray portion comprise aluminum alloy and wherein the first tray portion and the second tray portion are configured to contain a vaporizable precursor comprising a metal halide.

16. The tray assembly of claim 1, wherein the first tray portion and the second tray portion are coated with nickel using sputter deposition.

17. The tray assembly of claim 1, wherein the first tray portion and the second tray portion are coated with graphite, wherein the graphite comprises polycrystalline graphite having an amorphous carbon content of 20% to 80% by volume based on a total volume of the graphite.

18. A precursor delivery system comprising:

an ampoule; and the tray assembly according to claim 1.

19. The precursor delivery system of claim 18, wherein, in the expanded configuration, the first tray portion and the second tray portion push against an inner wall surface of the ampoule so as to be in thermal contact with the ampoule.

20. The precursor delivery system of claim 19, wherein, in the collapsed configuration, the first tray portion and the second tray portion are not in thermal contact with an inner wall surface of the ampoule.

* * * * *